US010096427B2

(12) United States Patent
Yoneda

(10) Patent No.: US 10,096,427 B2
(45) Date of Patent: Oct. 9, 2018

(54) ELECTRONIC COMPONENT

(71) Applicant: MURATA MANUFACTURING CO., LTD., Kyoto-fu (JP)

(72) Inventor: Masayuki Yoneda, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 15/408,797

(22) Filed: Jan. 18, 2017

(65) Prior Publication Data
US 2017/0229247 A1    Aug. 10, 2017

(30) Foreign Application Priority Data

Feb. 9, 2016   (JP) ................. 2016-022331

(51) Int. Cl.
*H01G 4/40*    (2006.01)
*H01F 27/28*   (2006.01)
(Continued)

(52) U.S. Cl.
CPC ........... *H01G 4/40* (2013.01); *H01F 27/2804* (2013.01); *H01F 27/29* (2013.01); *H01G 4/005* (2013.01);
(Continued)

(58) Field of Classification Search
CPC .......... H01G 4/40; H01G 4/005; H01G 4/012; H01G 4/228; H01G 4/232; H01G 4/30;
(Continued)

(56) References Cited

U.S. PATENT DOCUMENTS

2016/0126917 A1* 5/2016 Ahn ..................... H03H 1/0007
333/185

FOREIGN PATENT DOCUMENTS

JP      H09-293612 A    11/1997
JP      2001-134732 A    5/2001
(Continued)

OTHER PUBLICATIONS

An Office Action; "Notification of Reasons for Refusal," Mailed by the Japanese Patent Office dated Jul. 17, 2018, which corresponds to Japanese Patent Application No. 2016-022331 and is related to U.S. Appl. No. 15/408,797; with English language translation.

*Primary Examiner* — Eric Thomas
*Assistant Examiner* — Michael P McFadden
(74) *Attorney, Agent, or Firm* — Studebaker & Brackett PC

(57) ABSTRACT

The electronic component includes a substantially rectangular parallelepiped multilayer body formed by laminating a plurality of insulation layers, a capacitor including a plurality of capacitor conductor layers provided on the insulation layers, and a substantially spiral-shaped inductor including one or more inductor conductor layers provided on the insulation layers and having a center axis extending along the lamination direction. A mounting surface of the multilayer body is a surface of the multilayer body located on the end of one side of a first orthogonal direction orthogonal to the lamination direction. The inductor conductor layer and the capacitor conductor layer are provided on the first insulation layer. On the first insulation layer, an end portion of the capacitor conductor layer on the one side of the first orthogonal direction are closer to the mounting surface than an end portion of the inductor conductor layer on the one side of the first orthogonal direction.

11 Claims, 8 Drawing Sheets

(51) Int. Cl.
  *H01F 27/29* (2006.01)
  *H01G 4/005* (2006.01)
  *H01G 4/228* (2006.01)
  *H03H 1/00* (2006.01)
  *H03H 7/01* (2006.01)
  *H01G 4/30* (2006.01)
  *H01G 4/012* (2006.01)
  *H01G 4/232* (2006.01)

(52) U.S. Cl.
  CPC ............ *H01G 4/012* (2013.01); *H01G 4/228* (2013.01); *H01G 4/232* (2013.01); *H01G 4/30* (2013.01); *H03H 1/00* (2013.01); *H03H 7/0115* (2013.01); *H03H 2001/0085* (2013.01)

(58) Field of Classification Search
  CPC ....... H01F 27/2804; H01F 27/29; H03H 1/00; H03H 7/0115; H03H 2001/0085
  USPC ........................................................ 361/311
  See application file for complete search history.

(56) References Cited

FOREIGN PATENT DOCUMENTS

| | | |
|---|---|---|
| JP | 2011061760 A | 3/2011 |
| JP | 2012-079870 A | 4/2012 |
| JP | 2014-154716 A | 8/2014 |
| JP | 2015-046788 A | 3/2015 |

* cited by examiner

ELECTRONIC COMPONENT

CROSS REFERENCE TO RELATED APPLICATIONS

This application claims benefit of priority to Japanese Patent Application 2016-022331 filed Feb. 9, 2016, the entire content of which is incorporated herein by reference.

TECHNICAL FIELD

The present disclosure relates to electronic components, and particularly relates to an electronic component including a coil and a capacitor.

BACKGROUND

The label disclosed in Japanese Unexamined Patent Application Publication No. 2001-134732 is known as an example of a past disclosure regarding an electronic component. This label includes an upper layer sheet, a lower layer sheet, a coil, and a capacitor. The upper layer sheet and the lower layer sheet are laminated in an up-down direction. When viewed from above, the coil is constituted of two conductor patterns forming a substantially spiral shape, and is provided in the upper layer sheet and the lower layer sheet. The capacitor is constituted of two substantially rectangular capacitor patterns, and is provided in the upper layer sheet and the lower layer sheet. The coil and capacitor constitute a resonance circuit. In such a label, a lower surface of the lower layer sheet is affixed to printer toner or the like, for example.

SUMMARY

The degradation of coil characteristics is a problem in surface-mounted electronic components that have the same internal structure as the label disclosed in Japanese Unexamined Patent Application Publication No. 2001-134732 and include outer electrodes on the lower layer sheet side that are electrically connected to the coil and capacitor. To be more specific, an electronic component having the same type of structure as the stated label is mounted on a circuit board. In this case, the lower surface of the lower layer sheet becomes the mounting surface of the electronic component, and thus the circuit board is positioned on the lower side of the electronic component. As mentioned above, the coil has a substantially spiral shape when viewed from above, and thus produces a magnetic flux extending in the upper-lower direction. The magnetic flux is thus blocked by land electrodes, ground conductor layers, and the like provided on the circuit board, leading to the risk of eddy current arising in the land electrodes, ground conductor layers, and the like. Such eddy current is a cause of degradation in the coil characteristics.

Accordingly, it is an object of the present disclosure to provide an electronic component capable of suppressing degradation in the characteristics of an inductor.

An electronic component according to one embodiment of the present disclosure includes: a substantially rectangular parallelepiped multilayer body formed by laminating a plurality of insulation layers including a first insulation layer in a lamination direction; a capacitor including a plurality of capacitor conductor layers provided on the insulation layers; and a substantially spiral-shaped inductor including one or more inductor conductor layers provided on the insulation layers and having a center axis extending along the lamination direction. A mounting surface of the multilayer body is a surface of the multilayer body located on the end of one side of a first orthogonal direction orthogonal to the lamination direction. The inductor conductor layer and the capacitor conductor layer are provided on the first insulation layer. On the first insulation layer, an end portion of the capacitor conductor layer on the one side of the first orthogonal direction is closer to the mounting surface than an end portion of the inductor conductor layer on the one side of the first orthogonal direction.

According to one embodiment of the present disclosure, degradation in the characteristics of the inductor can be suppressed.

Other features, elements, characteristics and advantages of the present disclosure will become more apparent from the following detailed description of the present disclosure (with reference to the attached drawings).

DETAILED DESCRIPTION

An electronic component according to an embodiment serving as an aspect of the present disclosure will be described hereinafter.

Configuration of Electronic Component

Figure 1A:
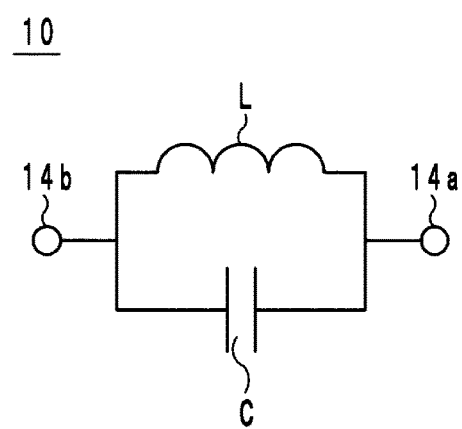
FIG. 1A is an equivalent circuit diagram of an electronic component according to an embodiment.
Figure 1B:
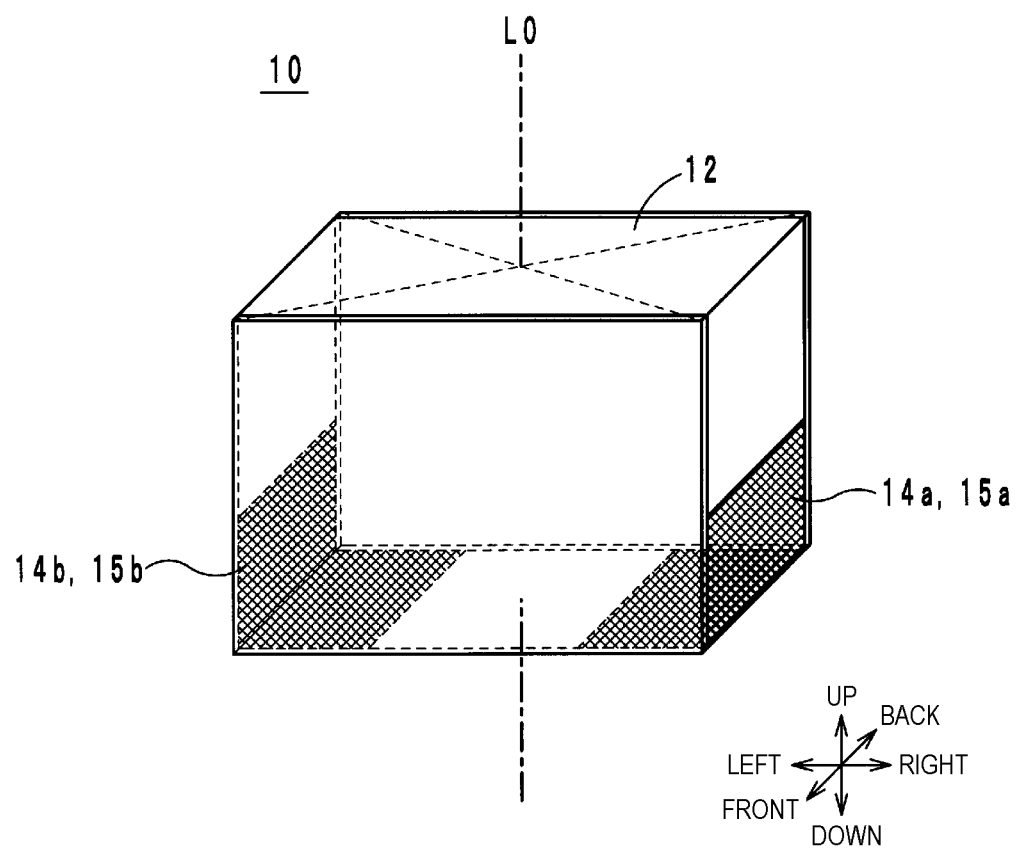
FIG. 1B is an external perspective view of the electronic component according to an embodiment.
Figure 2:
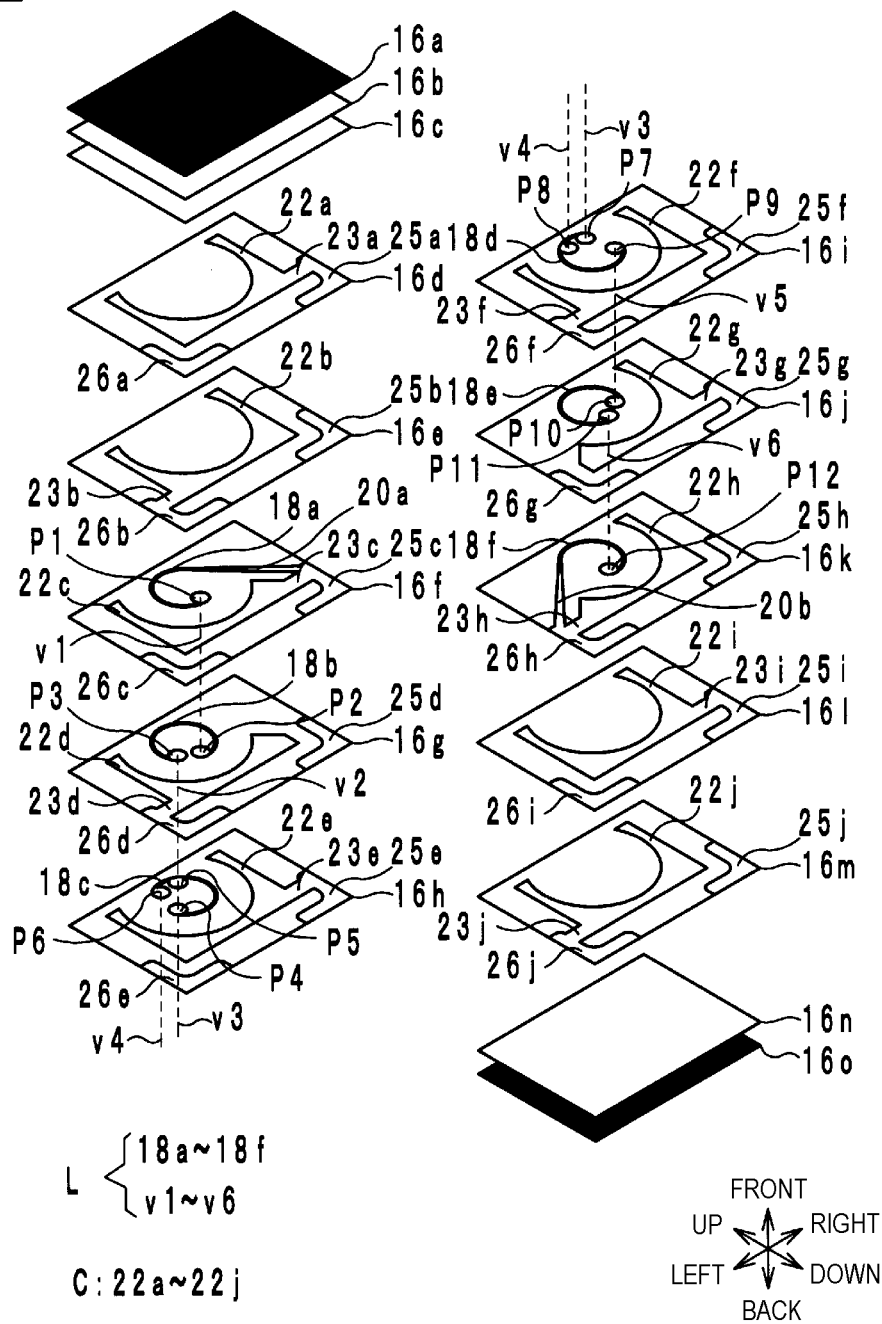
FIG. 2 is an exploded perspective view illustrating a multilayer body of the electronic component illustrated in FIG. 1B.
Figure 3A:
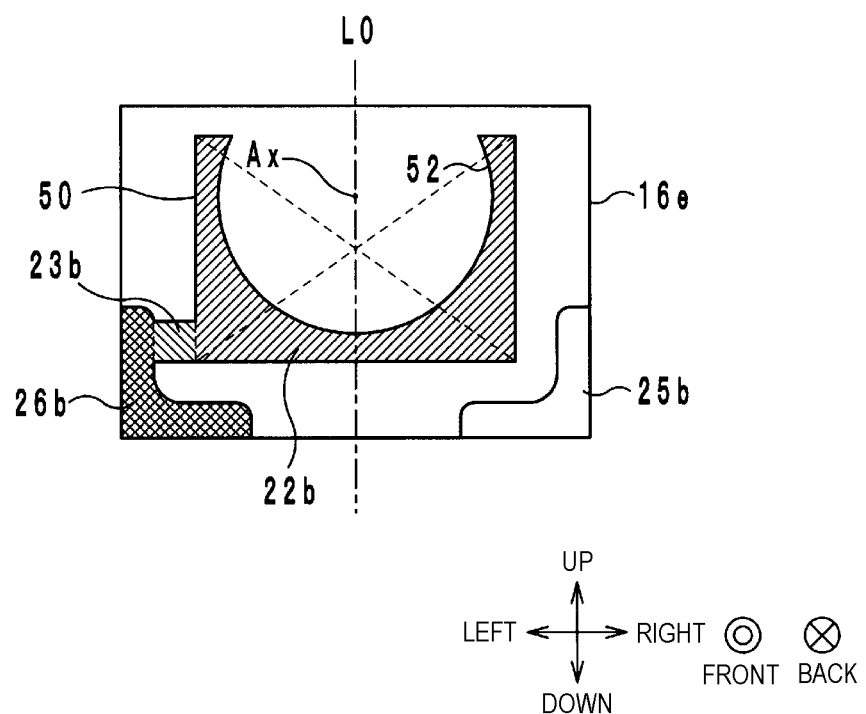
FIG. 3A is a diagram illustrating an insulation layer from the front.
Figure 3B:
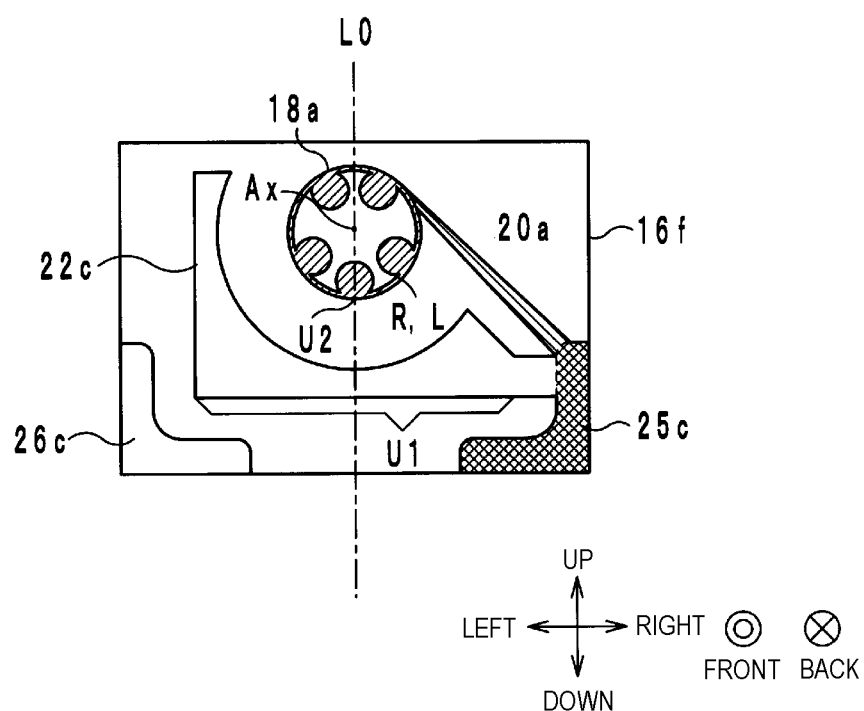
FIG. 3B is a diagram illustrating an insulation layer from the front.

The configuration of the electronic component according to the embodiment will be described hereinafter with reference to the drawings. FIG. 1A is an equivalent circuit diagram of an electronic component 10 according to the embodiment. FIG. 1B is an external perspective view of the electronic component 10 according to the embodiment. FIG. 2 is an exploded perspective view of a multilayer body 12 of the electronic component 10 illustrated in FIG. 1B. FIG. 3A is a diagram illustrating an insulation layer 16e from the front. FIG. 3B is a diagram illustrating an insulation layer 16f from the front. The electronic component 10 has, for example, a substantially rectangular parallelepiped shape whose each face is constituted of a substantially rectangular shape having a long side and a short side. However, the shape of the electronic component 10 is not limited thereto, and may be a substantially rectangular parallelepiped shape whose sides are substantially the same length, or a substantially polygonal column, cylinder, truncated polygonal cone, truncated circular cone, or other such shape. In the following, a lamination direction of the electronic component 10 is defined as a front-back direction. When viewed from the front, a direction following the long sides of the electronic component 10 is defined as a left-right direction (an example of a second orthogonal direction), and a direction following the short sides of the electronic component 10 is defined as an up-down direction (an example of a first orthogonal direction). The up-down direction, the left-right direction, and the front-back direction are substantially orthogonal to one another. The up-down direction, the left-right direction, and the front-back direction are merely examples used for descriptive purposes. As such, the up-down direction, left-right direction, and front-back direction of the electronic component 10 when the component is being used need not match the actual up-down direction, left-right direction, and front-back direction.

As an equivalent circuit, the electronic component 10 includes an inductor L, a capacitor C, and outer electrodes 14a and 14b. The inductor L and the capacitor C constitute an LC parallel resonator by being connected to each other in parallel. One end of the LC parallel resonator is connected to the outer electrode 14a and another end of the LC parallel resonator is connected to the outer electrode 14b. The electronic component does not include outer electrodes aside from the outer electrodes 14a and 14b. For example, the electronic component does not include an outer electrode connected to a ground potential.

The structure of the electronic component 10 will be described next. As illustrated in FIGS. 1B and 2, the electronic component 10 includes the multilayer body 12, the outer electrodes 14a and 14b, lead conductor layers 20a, 20b, and 23a-23j, the capacitor C, and the inductor L. The lead conductor layers 20a and 20b are thus not part of the inductor L. Likewise, the lead conductor layers 23a-23j are not part of the capacitor C.

As illustrated in FIG. 2, the multilayer body 12 is constituted by laminating substantially rectangular insulation layers 16a-16o (an example of a plurality of insulation layers) so as to be arranged in that order from a front side to a back side, and has a substantially rectangular parallelepiped shape. A mounting surface of the multilayer body 12 is a surface of the multilayer body 12 located on a lower-side (an example of one side in the first orthogonal direction) end thereof (that is, a lower surface). The mounting surface is a surface that faces a circuit board when mounting the electronic component 10 on the circuit board. The lower surface of the multilayer body 12 is formed by the contiguous long sides on the lower sides of the insulation layers 16a-16o.

As illustrated in FIG. 2, the insulation layers 16a-16o are substantially rectangular in shape, and are formed of an insulating material that has borosilicate glass as a primary component, for example. Hereinafter, front-side surfaces of the insulation layers 16a-16o will be called front surfaces, and back-side surfaces of the insulation layers 16a-16o will be called back surfaces.

The insulation layers 16a and 16o have different colors than the insulation layers 16b-16n. This makes it possible to distinguish the front and back surfaces of the electronic component 10 from the upper and lower surfaces of the electronic component 10. Whether or not the electronic component 10 has overturned can thus be confirmed when the electronic component 10 is being mounted.

The outer electrode 14a (an example of a first outer electrode) is electrically connected to the inductor L and the capacitor C, which will be discussed later. When viewed from the front-back direction, the outer electrode 14a has a substantially L shape, straddling the lower surface and a right surface (an example of a first side surface located on the end of one side of the second orthogonal direction) of the multilayer body 12. The outer electrode 14a includes a covering layer 15a and outer conductor layers 25a-25j.

As illustrated in FIG. 2, the outer conductor layers 25a-25j are provided on the insulation layers 16d-16m. The outer conductor layers 25a-25j have substantially L shapes, and when viewed from the front, are provided near the lower-right corners of the insulation layers 16d-16m. Each of the outer conductor layers 25a-25j passes through the insulation layers 16d-16m in the front-back direction. Accordingly, when viewed from the front, the outer conductor layers 25a-25j overlap when in a matching state, and outer conductor layers adjacent in the front-back direction are connected to each other. As a result, the outer conductor layers 25a-25j are exposed from the multilayer body 12 on the right and lower surfaces of the multilayer body 12. The outer conductor layers 25a-25j are formed from a conductive material having a low-electrical resistance metal such as Ag, Cu, or Au as a primary component.

The covering layer 15a covers the parts of the outer conductor layers 25a-25j exposed from the multilayer body 12. The covering layer 15a is formed through Sn plating upon Ni plating. Rather than Ni or Sn, the covering layer 15a may be formed from a material having high solder resistance, wettability, or the like, such as Cu, Au, or an alloy thereof.

The outer electrode 14b (an example of a second outer electrode) is electrically connected to the inductor L and the capacitor C, which will be discussed later. When viewed from the front-back direction, the outer electrode 14b has a substantially L shape, straddling the lower surface and a left surface (an example of a second side surface located on the end of another side of the second orthogonal direction) of the multilayer body 12. The outer electrode 14b includes a covering layer 15b and outer conductor layers 26a-26j.

As illustrated in FIG. 2, the outer conductor layers 26a-26j are provided on the insulation layers 16d-16m. The outer conductor layers 26a-26j have substantially L shapes, and when viewed from the front, are provided near the lower-left corners of the insulation layers 16d-16m. Each of the outer conductor layers 26a-26j passes through the insulation layers 16d-16m in the front-back direction. Accordingly, when viewed from the front, the outer conductor layers 26a-26j overlap when in a matching state, and outer conductor layers adjacent in the front-back direction are connected to each other. As a result, the outer conductor layers 26a-26j are exposed from the multilayer body 12 on the left and lower surfaces of the multilayer body 12. The outer conductor layers 26a-26j are formed from a conductive material having a low-electrical resistance metal such as Ag, Cu, or Au as a primary component.

The covering layer 15b covers the parts of the outer conductor layers 26a-26j exposed from the multilayer body 12. The covering layer 15b is formed through Sn plating upon Ni plating. Rather than Ni or Sn, the covering layer 15b may be formed from a material having high solder resistance, wettability, or the like, such as Cu, Au, or an alloy thereof.

Note that because the outer conductor layers 25a-25j and 26a-26j pass through the insulation layers 16d-16m in the up-down direction, the lower-right and lower-left corners of the insulation layers 16d-16m are cut out in substantially L shapes. In other words, the insulation layers 16d-16m do not have a strict rectangular shape. Thus it is sufficient for the insulation layers 16d-16m to be substantially rectangular in shape, as in this case.

The inductor L is a coil, including inductor conductor layers 18a-18f (an example of one or more inductor conductor layers) and via hole conductors v1-v6, having a substantially spiral shape with a center axis Ax (see FIG. 3B) extending in the front-back direction. In the electronic component 10, when viewed from the front, the inductor L has a substantially helical shape that progresses from the front to the back while winding in a counterclockwise direction. The diameter of the inductor L is substantially uniform.

The inductor conductor layers 18a-18f are substantially linear conductor layers, provided (laminated) on front surfaces (an example of a main surface) of the insulation layers 16f-16k, respectively, that form shapes in which a ring is partially cut out (that is, substantially C shapes). When viewed from the front, the inductor conductor layers 18a-18f overlap with each other and form a substantially annular path R (see FIG. 3B). When viewed from the front, the center of the path R matches the center axis Ax, and overlaps with a straight line L0 (see FIGS. 1B and 3B). The straight line L0 is a straight line, parallel to the up-down direction, that passes through a point where diagonal lines of the mounting surface of the multilayer body 12 intersect.

The inductor conductor layers 18a-18f are formed from a conductive material having a low-electrical resistance metal such as Ag, Cu, or Au as a primary component. Hereinafter, an end portion of the inductor conductor layers 18a-18f on an upstream side in the counterclockwise direction will be called an "upstream end", and an end portion of the inductor conductor layers 18a-18f on a downstream side in the counterclockwise direction will be called a "downstream end".

The inductor conductor layers 18a-18f are provided with connecting parts P1-P12 for connecting the via hole conductors v1-v6, which will be discussed later. The connecting parts P1-P12 are substantially circular in shape. However, the connecting parts P1-P12 may be shapes aside from circles, such as substantially polygonal, semicircular, fan shape, or elliptical shapes, a combination thereof, or the like. Diameters of the connecting parts P1-P12 are greater than the line widths of the parts of the inductor conductor layers 18a-18f aside from the connecting parts P1-P12. The connecting part P1 is provided on the downstream end of the inductor conductor layer 18a. The connecting part P2 is provided on the upstream end of the inductor conductor layer 18b. The connecting part P3 is provided on the downstream end of the inductor conductor layer 18b. The connecting part P4 is provided on the upstream end of the inductor conductor layer 18c. The connecting part P5 is provided near the downstream end of the inductor conductor layer 18c. The connecting part P6 is provided on the downstream end of the inductor conductor layer 18c. The connecting part P7 is provided on the upstream end of the inductor conductor layer 18d. The connecting part P8 is provided near the upstream end of the inductor conductor layer 18d. The connecting part P9 is provided on the downstream end of the inductor conductor layer 18d. The connecting part P10 is provided on the upstream end of the inductor conductor layer 18e. The connecting part P11 is provided on the downstream end of the inductor conductor layer 18e. The connecting part P12 is provided on the upstream end of the inductor conductor layer 18f.

Each of the via hole conductors v1-v6 passes through the insulation layers 16f-16j in the front-back direction. The via hole conductor v1 connects the connecting part P1 and the connecting part P2. The via hole conductor v2 connects the connecting part P3 and the connecting part P4. The via hole conductor v3 connects the connecting part P5 and the connecting part P7. The via hole conductor v4 connects the connecting part P6 and the connecting part P8. The via hole conductor v5 connects the connecting part P9 and the connecting part P10. The via hole conductor v6 connects the connecting part P11 and the connecting part P12. As a result, the inductor conductor layers 18a-18f are electrically connected in serial in a substantially spiral shape by the via hole conductors v1-v6, thus forming the inductor L having a high inductance. The via hole conductors v1-v6 are formed from a conductive material having a low-electrical resistance metal such as Ag, Cu, or Au as a primary component.

The lead conductor layer 20a is a substantially linear conductor layer provided on the front surface of the insulation layer 16f. The lead conductor layer 20a connects the upstream end of the inductor conductor layer 18a to the outer conductor layer 25c. The lead conductor layer 20b is a substantially linear conductor layer provided on the front surface of the insulation layer 16k. The lead conductor layer 20b connects the downstream end of the inductor conductor layer 18f to the outer conductor layer 26h. As a result, the inductor L is electrically connected between the outer electrode 14a and the outer electrode 14b. The lead conductor layers 20a and 20b are formed from a conductive material having a low-electrical resistance metal such as Ag, Cu, or Au as a primary component.

Next, borders between the inductor conductor layers 18a and 18f and the lead conductor layers 20a and 20b, and borders between the outer conductor layers 25c and 26h and the lead conductor layers 20a and 20b, will be described. The lead conductor layer 20a will be used as an example and described next with reference to FIG. 3B. However, the same descriptions as those for the lead conductor layer 20a apply to the lead conductor layer 20b, and will thus be omitted here.

The inductor conductor layer 18a is a part located on the substantially annular path R, and the conductor layer not located on the path R is not the inductor conductor layer 18a. Accordingly, the border between the inductor conductor layer 18a and the lead conductor layer 20a is a part where the lead conductor layer 20a makes contact with the path R. Meanwhile, the outer conductor layers 25a-25j have substantially the same shape and substantially overlap with each other. Thus conductor layers that do not substantially overlap with the outer conductor layers 25a-25j are not the outer conductor layers 25a-25j. Accordingly, the border between the outer conductor layer 25c and the lead conductor layer 20a is a part where the lead conductor layer 20a makes contact with a region formed by the outer conductor layers 25a-25j substantially overlapping with each other. Note that "substantially overlapping" means that a slight amount of non-overlap caused by manufacturing variations or the like is permitted.

The capacitor C includes capacitor conductor layers 22a-22j (an example of a plurality of capacitor conductor layers). The capacitor conductor layers 22a-22j are formed from a conductive material having a low-electrical resistance metal such as Ag, Cu, or Au as a primary component. The capacitor conductor layers 22a, 22b, 22e, 22f, 22i, and 22j are provided (laminated) on the front surfaces (an example of a main surface) of the insulation layers 16d, 16e, 16h, 16i, 16l, and 16m, respectively, have substantially U shapes, and when viewed from the front, overlap when in a matching state. Hereinafter, the capacitor conductor layer 22b will be described as an example, with reference to FIG. 3A. However, the same descriptions as those for the capacitor conductor layer 22b apply to the capacitor conductor layers 22a, 22e, 22f, 22i, and 22j, and will thus be omitted here.

The capacitor conductor layer 22b has a shape in which a circle 52 has been cut out from a rectangle 50. The rectangle has long sides extending in the left-right direction and short sides extending in the up-down direction. Additionally, when viewed from the front, a point where diagonal lines of the rectangle 50 intersect is located on the straight line L0. The diameter of the circle 52 is shorter than the long sides of the rectangle 50. Furthermore, the center of the circle 52 is located higher than the diagonal lines of the rectangle 50, and matches the center of the path R (that is, the center axis Ax). Accordingly, the long side on the upper side of the rectangle 50 is cut out by the circle 52. Additionally, when viewed from the front-back direction, there is a constant amount of space between the capacitor C and the inductor L.

The capacitor conductor layers 22c and 22d are provided (laminated) on the front surfaces (an example of a main surface) of the insulation layers 16f and 16g, respectively, have substantially L shapes, and when viewed from the front, overlap when in a matching state. The capacitor conductor layers 22c and 22d have shapes in which a right-side short side of 22a, 22b, 22e, 22f, 22i, and 22j is missing. The capacitor conductor layers 22g and 22h are provided (laminated) on the front surfaces (an example of a main surface) of the insulation layers 16j and 16k, respectively, have substantially L shapes, and when viewed from the front, overlap when in a matching state. The capacitor conductor layers 22g and 22h have shapes in which a left-side short side of 22a, 22b, 22e, 22f, 22i, and 22j is missing. Accordingly, the capacitor conductor layers 22c, 22d, 22g, and 22h overlap with the capacitor conductor layers 22a, 22b, 22e, 22f, 22i, and 22j when viewed from the front. At this time, the capacitor conductor layers 22a-22j oppose each other with the insulation layers 16d-16l interposed therebetween, thus forming the laminated capacitor C having a high capacitance.

The lead conductor layers 23a-23j are substantially linear conductor layers provided on the front surfaces of the insulation layers 16d-16m, respectively. The lead conductor layer 23a connects the capacitor conductor layer 22a and the outer conductor layer 25a. The lead conductor layer 23b connects the capacitor conductor layer 22b and the outer conductor layer 26b. The lead conductor layer 23c connects the capacitor conductor layer 22c and the outer conductor layer 25c. The lead conductor layer 23d connects the capacitor conductor layer 22d and the outer conductor layer 26d. The lead conductor layer 23e connects the capacitor conductor layer 22e and the outer conductor layer 25e. The lead conductor layer 23f connects the capacitor conductor layer 22f and the outer conductor layer 26f. The lead conductor layer 23g connects the capacitor conductor layer 22g and the outer conductor layer 25g. The lead conductor layer 23h connects the capacitor conductor layer 22h and the outer conductor layer 26h. The lead conductor layer 23i connects the capacitor conductor layer 22i and the outer conductor layer 25i. The lead conductor layer 23j connects the capacitor conductor layer 22j and the outer conductor layer 26j. As a result, the capacitor C is electrically connected between the outer electrode 14a and the outer electrode 14b. The inductor L and the capacitor C thus constitute an LC parallel resonator by being connected to each other in parallel. The lead conductor layers 23a-23j are formed from a conductive material having a low-electrical resistance metal such as Ag, Cu, or Au as a primary component.

Next, borders between the capacitor conductor layers 22a-22j and the lead conductor layers 23a-23j, and borders between the outer conductor layers 25a, 26b, 25c, 26d, 25e, 26f, 25g, 26h, 25i, and 26j and the lead conductor layers 23a-23j, will be described. The lead conductor layer 23b will be used as an example and described next with reference to FIG. 3A. However, the same descriptions as those for the lead conductor layer 23b apply to the lead conductor layers 23a and 23c-23j, and will thus be omitted here.

The capacitor conductor layers 22a-22j are parts that contribute to the formation of the capacitor C, and are parts that, when viewed from the front, substantially overlap with any one of the capacitor conductor layers 22a-22j adjacent thereto in the front-back direction with one of the insulation layers 16d-16l interposed therebetween. Accordingly, a conductor layer that does not substantially overlap with any one of the capacitor conductor layers 22a-22j adjacent thereto in the front-back direction with one of the insulation layers 16d-16l interposed therebetween is not one of the capacitor conductor layers 22a-22j. As such, the border between the capacitor conductor layer 22b and the lead conductor layer 23b is a part where the lead conductor layer 23b makes contact with a region formed by the capacitor conductor layers 22a-22j substantially overlapping as described above. Meanwhile, the outer conductor layers 26a-26j have substantially the same shape and substantially overlap with each other. Thus conductor layers that do not substantially overlap with the outer conductor layers 26a-26j are not the outer conductor layers 26a-26j. Accordingly, the border between the outer conductor layer 26b and the lead conductor layer 23b is a part where the lead conductor layer 23b makes contact with a region formed by the outer conductor layers 26a-26j substantially overlapping with each other.

With the inductor L and capacitor C configured as described above, the capacitor C has a shape in which the circle 52 is cut out from the rectangle 50 when viewed from the front. The center of the circle 52 and the center of the path R of the inductor L match. Furthermore, the diameter of the circle 52 is greater than the diameter of the path R. As such, the inductor L fits within the circle 52 when viewed from the front. Here, the inductor conductor layers 18a-18f and the capacitor conductor layers 22c-22h are provided on the front surfaces of the insulation layers 16f-16k (an example of a first insulation layer), respectively. On the front surfaces of the insulation layers 16f-16k, lower ends U1 of the capacitor conductor layers 22c-22h (an example of an end portion of a capacitor conductor layer on one side of an orthogonal direction) are located closer to the lower surface of the multilayer body 12 than lower ends U2 of the inductor conductor layers 18a-18f (an example of an end portion of an inductor on one side of an orthogonal direction) (see FIG. 3B). In particular, in the electronic component 10 according to the present embodiment, the lower end of the capacitor C is located closer to the lower surface of the multilayer body 12 than the lower end of the inductor L. Additionally, when viewed from the front, the inductor L and the capacitor C do not overlap.

Furthermore, in the electronic component 10, the capacitor conductor layers 22c-22h are, when viewed from the front, present between the inductor conductor layers 18a-18f and the lower surface of the multilayer body 12 on the front surfaces of the insulation layers 16f-16k, as illustrated in FIGS. 2 and 3B. Accordingly, in the insulation layers 16f-16k, the inductor conductor layers 18a-18f, the capacitor conductor layers 22c-22h, and the lower surface of the multilayer body 12 are arranged in that order on an imaginary line parallel to the up-down direction and passing through the center axis Ax (this imaginary line matches the straight line L0 in FIG. 3B). The capacitor conductor layers 22e and 22f have substantially U shapes, and thus when viewed from the front, straddle a region between the inductor conductor layers 18c and 18d and a left short side (an example of a first side) of the insulation layers 16h and 16i, a region between the inductor conductor layers 18c and 18d and a lower long side (an example of a third side) of the insulation layers 16h and 16i, and a region between the inductor conductor layers 18c and 18d and a right short side (an example of a second side) of the insulation layers 16h and 16i. However, the capacitor conductor layers 22a-22j are not present between the center axis Ax and an upper long side (an example of a fourth side) of the insulation layers 16d-16m.

Additionally, in the electronic component 10, the inductor L and the capacitor C have a substantially two-fold rotational symmetrical structure with respect to the straight line L0 (an example of an axis). More specifically, the following combinations are in linearly symmetrical relationships with respect to the straight line L0 when viewed from the front.

capacitor conductor layer 22a and capacitor conductor layer 22j
capacitor conductor layer 22b and capacitor conductor layer 22i
capacitor conductor layer 22c and capacitor conductor layer 22h
capacitor conductor layer 22d and capacitor conductor layer 22g
capacitor conductor layer 22e and capacitor conductor layer 22f
inductor conductor layer 18a and inductor conductor layer 18f
inductor conductor layer 18b and inductor conductor layer 18e
inductor conductor layer 18c and inductor conductor layer 18d As a result, the inductor L and the capacitor C substantially match an inductor L and capacitor C rotated approximately 180 degrees around the straight line L0.

Furthermore, in the electronic component 10, the lead conductor layers 20a, 20b, and 23a-23j and the outer electrodes 14a and 14b also have substantially two-fold rotational symmetrical structures with respect to the straight line L0. More specifically, the following combinations are in linearly symmetrical relationships with respect to the straight line L0 when viewed from the front.

lead conductor layer 20a and lead conductor layer 20b
lead conductor layer 23a and lead conductor layer 23j
lead conductor layer 23b and lead conductor layer 23i
lead conductor layer 23c and lead conductor layer 23h
lead conductor layer 23d and lead conductor layer 23g
lead conductor layer 23e and lead conductor layer 23f
outer conductor layer 25a and outer conductor layer 26j
outer conductor layer 25b and outer conductor layer 26i
outer conductor layer 25c and outer conductor layer 26h
outer conductor layer 25d and outer conductor layer 26g
outer conductor layer 25e and outer conductor layer 26f
outer conductor layer 25f and outer conductor layer 26e
outer conductor layer 25g and outer conductor layer 26d
outer conductor layer 25h and outer conductor layer 26c
outer conductor layer 25i and outer conductor layer 26b
outer conductor layer 25j and outer conductor layer 26a As a result, the lead conductor layers 20a, 20b, and 23a-23j and the outer electrodes 14a and 14b substantially match lead conductor layers 20a, 20b, and 23a-23j and outer electrodes 14a and 14b rotated approximately 180 degrees around the straight line L0.

Method of Manufacturing Electronic Component

A method of manufacturing the electronic component 10 according to the present embodiment will be described hereinafter with reference to FIG. 2.

First, a mother insulation layer to serve as the insulation layer 16o is formed. The mother insulation layer is a large-size insulation layer in which a plurality of insulation layers 16o that are connected to each other are arranged in a matrix. An insulating paste having borosilicate glass as its primary component is spread upon an approximately 8-inch-square carrier film through screen printing, after which the entirety of the insulating paste is exposed with ultraviolet light. The insulating paste is cured as a result, thus forming the mother insulation layer to serve as the insulation layer 16o. An insulating paste having a post-firing relative dielectric constant of approximately 6 is used in the present embodiment. Additionally, the insulating paste used for the insulation layer 16o is given a different coloring than an insulating paste used for the insulation layers 16b-16n.

Next, a mother insulation layer to serve as the insulation layer 16n is formed. The formation of the mother insulation layer to serve as the insulation layer 16n is the same as the formation of the mother insulation layer to serve as the insulation layer 16o, and thus descriptions thereof will be omitted.

Next, a mother insulation layer to serve as the insulation layer 16m is formed. An insulating paste having borosilicate glass as its primary component is spread upon the mother insulation layer to serve as the insulation layer 16n through screen printing, after which the insulating paste is exposed with ultraviolet light through a photomask that covers positions where the outer conductor layers 25j and 26j are to be formed. The insulating paste in parts aside from those covered by the photomask is cured as a result. The uncured insulating paste is then removed with an alkali solution or the like. The mother insulation layer to serve as the insulation layer 16m, in which the lower-right and lower-left corners are cut out, is formed as a result.

Next, the capacitor conductor layer 22j, the lead conductor layer 23j, and the outer conductor layers 25j and 26j are formed through photolithography. Specifically, a photosensitive conductive paste having Ag as a primary metal component is spread through printing, forming a conductive paste layer on the mother insulation layer to serve as the insulation layer 16m. At this time, the cutouts formed in the mother insulation layer to serve as the insulation layer 16m are also filled with the conductive paste. Furthermore, the conductive paste layer is irradiated with ultraviolet light or the like through a photomask and then developed using an alkali solution or the like. The capacitor conductor layer 22j, the lead conductor layer 23j, and the outer conductor layers 25j and 26j are formed on the mother insulation layer to serve as the insulation layer 16m as a result.

Thereafter, mother insulation layers to serve as the insulation layers 16d-16l, the inductor conductor layers 18a-18f, the lead conductor layers 20a, 20b, and 23a-23i, the capacitor conductor layers 22a-22i, the outer conductor layers 25a-25i and 26a-26i, and the via hole conductors v1-v6 are formed by alternately repeating the process of forming the mother insulation layer to serve as the insulation layer 16m and the process of forming the capacitor conductor layer 22j and the outer conductor layers 25j and 26j. Note that when forming the mother insulation layers to serve as the insulation layers 16f-16j in which the via hole conductors v1-v6 are formed, the exposure is carried out through a photomask that covers the locations where the via hole conductors v1-v6 are to be formed.

Next, mother insulation layers to serve as the insulation layers 16a-16c are formed. The formation of the mother insulation layers to serve as the insulation layers 16a-16c is the same as the formation of the mother insulation layer to serve as the insulation layer 16o, and thus descriptions thereof will be omitted. The insulating paste used for the insulation layer 16a is given a different coloring than the insulating paste used for the insulation layers 16b-16n. A mother multilayer body, in which a plurality of multilayer bodies 12 that are connected to each other are arranged in a matrix, is obtained as a result of the processes described above.

Next, the mother multilayer body is cut into a plurality of unfired multilayer bodies 12 with a dicing machine or the like. In the process of cutting the mother multilayer body, the outer conductor layers 25a-25j and 26a-26j are exposed on the multilayer body 12 from cut faces formed by the cutting. Note that the multilayer body 12 shrinks during firing, which will be discussed later, and thus the mother multilayer body is cut having factored in such shrinkage.

The unfired multilayer body 12 is then fired under predetermined conditions to obtain the multilayer body 12. The multilayer body 12 is furthermore subjected to barrel finishing.

Finally, the parts of the outer conductor layers 25a-25j and 26a-26j exposed on the multilayer body 12 are plated with Ni and Sn. The electronic component 10 is completed through the process described thus far. Note that the above manufacturing method is merely an example, and may be replaced with or used in addition to another known manufacturing method as long as doing so realizes the structure of the electronic component 10.

Effects

According to the electronic component 10, degradation in the characteristics of the inductor L can be suppressed. To describe in more detail, the mounting surface of the multilayer body 12 is the lower surface of the multilayer body 12. Thus when the electronic component 10 is mounted on a circuit board, the circuit board is located below the electronic component 10. Meanwhile, the center axis Ax of the inductor L extends in the front-back direction. Many magnetic fluxes extending along the center axis Ax are produced near the center axis Ax of the inductor L. Thus in the electronic component 10, the magnetic flux produced by the inductor L being blocked by land electrodes, ground conductor layers, or the like in the circuit board is suppressed, and the generation of eddy current is suppressed as well. As a result, in the electronic component 10, a drop in the inductance value and Q value of the inductor L is suppressed, and degradation in the characteristics of the inductor L is suppressed.

Additionally, according to the electronic component 10, degradation in the characteristics of the inductor L can be suppressed for the following reasons as well. To describe in detail, the lower ends U1 of the capacitor conductor layers 22c-22h are located closer to the lower surface of the multilayer body 12 than the lower ends U2 of the inductor conductor layers 18a-18f on the front surfaces of the insulation layers 16f-16k, respectively. Thus the inductor L is distanced from the lower surface of the multilayer body 12, and is also distanced from the circuit board on which the electronic component 10 is mounted. Thus the magnetic flux produced by the inductor L being blocked by land electrodes, ground conductor layers, or the like in the circuit board is suppressed, and the generation of eddy current is suppressed as well. As a result, in the electronic component 10, a drop in the inductance value and Q value of the inductor L is suppressed, and degradation in the characteristics of the inductor L is suppressed.

Note that in the electronic component 10, the capacitor conductor layers 22c-22h are, when viewed from the front, present between the inductor conductor layers 18a-18f and the lower surface of the multilayer body 12 on the front surfaces of the insulation layers 16f-16k. The inductor L is therefore distanced further from the lower surface of the multilayer body 12. As a result, in the electronic component 10, a drop in the inductance value and Q value of the inductor L is more effectively suppressed, and degradation in the characteristics of the inductor L is more effectively suppressed.

Furthermore, according to the electronic component 10, variations in the characteristics of the inductor L can be suppressed. To describe in more detail, with a circuit board to which is mounted a surface-mounted electronic component that has the same internal structure as the label disclosed in Japanese Unexamined Patent Application Publication No. 2001-134732 and includes outer electrodes on the lower layer sheet side that are electrically connected to the coil and capacitor, the structure of the circuit board will differ depending on the electronic device in which the electronic component is used. Therefore, the arrangement of land electrodes, ground conductor layers, and so on present in a region surrounding the surface-mounted electronic component that has the same internal structure as the label disclosed in Japanese Unexamined Patent Application Publication No. 2001-134732 and includes outer electrodes on the lower layer sheet side that are electrically connected to the coil and capacitor will also differ depending on the electronic device in which the electronic component is used. The number of magnetic fluxes blocked by the land electrodes, ground conductor layers, and the like, will thus vary from electronic device to electronic device, and amounts of eddy current will also vary from electronic device to electronic device. In particular, in the electronic component, the magnetic flux extends along the up-down direction, which means that many magnetic fluxes may be blocked by the land electrodes, ground conductor layers, and the like, and that the number of blocked magnetic fluxes increases easily as well. It is therefore easy for variation in the amount of eddy current to increase as well. As a result, in surface-mounted electronic components that have the same internal structure as the label disclosed in Japanese Unexamined Patent Application Publication No. 2001-134732 and include outer electrodes on the lower layer sheet side that are electrically connected to the coil and capacitor, variation in the inductance value and Q value of the coil increases, and variation in the characteristics of the coil increases as well.

Accordingly, in the electronic component 10, the center axis Ax of the inductor L extends in the front-back direction. Furthermore, when viewed from the front, the lower ends U1 of the capacitor conductor layers 22c-22h are located closer to the lower surface of the multilayer body 12 than the lower ends U2 of the inductor conductor layers 18a-18f on the front surfaces of the insulation layers 16f-16k, respectively. This suppresses the number of magnetic fluxes blocked by the land electrodes, ground conductor layers, and the like of the circuit board. As a result, variation in the inductance value and Q value of the inductor L is suppressed, and variation in the characteristics of the inductor L depending on the positions of the land electrodes, ground conductor layers, and so on in the circuit board is suppressed as well. Furthermore, because there is little variation in the characteristics of the inductor L, the electronic component 10 does not require a ground electrode connected to a ground potential.

Additionally, in the electronic component 10, the inductor L and the capacitor C form an LC parallel resonator. Attenuation at the resonant frequency of the LC parallel resonator depends on the Q value of the inductor L. As such, suppressing a drop in the Q value of the inductor L as described above increases the attenuation at the resonant frequency of the LC parallel resonator. Furthermore, suppressing variation in the Q value of the inductor L as described above suppresses variation in the attenuation at the resonant frequency of the LC parallel resonator.

Meanwhile, the resonant frequency of the LC parallel resonator depends on the inductance value of the inductor L. As such, suppressing variation in the inductance value of the inductor L as described above suppresses variation in the resonant frequency of the LC parallel resonator.

Additionally, with the electronic component 10, it is not necessary to consider the direction of the electronic component 10 when mounting the electronic component 10 on a circuit board. A case in which the electronic component 10 is mounted on a circuit board having a first land electrode and a second land electrode will be described as an example next.

In the following, a method of connecting the first land electrode to the outer electrode 14a and connecting the second land electrode to the outer electrode 14b in the electronic component 10 will be called a first connection method. Additionally, a method of connecting the second land electrode to the outer electrode 14a and connecting the first land electrode to the outer electrode 14b in the electronic component 10 will be called a second connection method. In the electronic component 10, the inductor L and the capacitor C have a substantially two-fold rotational symmetrical structure with respect to the straight line L0, and thus the arrangement of the inductor L and the capacitor C in the first connection method substantially matches the arrangement of the inductor L and the capacitor C in the second connection method. As such, a distribution of magnetic fluxes produced by the inductor L in the first connection method is substantially the same as a distribution of magnetic fluxes produced by the inductor L in the second connection method. Thus the number of magnetic fluxes blocked by the land electrodes, ground conductor layers, and so on of the circuit board is substantially the same, and the drop in the inductance value and Q value of the inductor L is substantially the same, in the first connection method and the second connection method. In other words, variation in the characteristics of the inductor L does not easily arise between the first connection method and the second connection method. Thus it is not necessary to consider the direction of the electronic component 10 when mounting the electronic component 10 on a circuit board.

Variation in electrical effects (noise, for example) on the inductor L and the capacitor C from surrounding electronic components, the circuit board, and so on between the first connection method and the second connection method is also suppressed. Thus in this sense as well, it is not necessary to consider the direction of the electronic component 10 when mounting the electronic component 10 on a circuit board.

Additionally, in the electronic component 10, the inductor L and the capacitor C do not overlap when viewed from the front, and thus the magnetic flux produced by the inductor L being blocked by the capacitor C is suppressed. As a result, in the electronic component 10, a drop in the inductance value and Q value of the inductor L is suppressed, and degradation in the characteristics of the inductor L is suppressed.

Additionally, in the electronic component 10, the surface areas of the capacitor conductor layers 22a, 22b, 22e, 22f, and 22i provided on the front surfaces of the insulation layers 16d, 16e, 16h, 16i, 16l, and 16m can be increased, which makes it possible to configure the capacitor C having a higher capacitance.

Incidentally, the circuit board is present below the electronic component 10, and electronic components or the like are present to the right and left of the electronic component. However, it is often the case that there is a wide open space above the electronic component 10, where no electronic components, circuit boards, or the like are present. It is thus unlikely that magnetic fluxes will be blocked at the upper surface of the electronic component 10. As such, when the electronic component 10 is viewed from the front, the capacitor C is not present between the center axis Ax and the upper surface, and the inductor L is provided close to the upper surface. A situation where a magnetic flux, of the magnetic fluxes produced by the inductor L, that passes through the upper surface side is blocked by the capacitor C is therefore suppressed.

Additionally, in the electronic component 10, a capacitance value of the LC parallel resonator can be increased. To describe in more detail, when viewed from the front, the lower ends U1 of the capacitor conductor layers 22c-22h are located closer to the lower surface of the multilayer body 12 than the lower ends U2 of the inductor conductor layers 18a-18f. Additionally, the outer electrodes 14a and 14b are provided on the lower surface of the multilayer body 12. The capacitor C and the outer electrodes 14a and 14b are therefore close to each other, which increases the capacitance produced therebetween. The capacitance value of the LC parallel resonator can be increased as a result.

In the electronic component 10, the capacitance value of the LC parallel resonator can be increased for another reason as well. To describe in more detail, the outer electrodes 14a and 14b are provided on the right surface and the left surface of the multilayer body 12, respectively. The capacitor C and the outer electrodes 14a and 14b therefore have a greater opposing surface area, which increases the capacitance produced therebetween. The capacitance value of the LC parallel resonator can be increased as a result.

Figure 4:
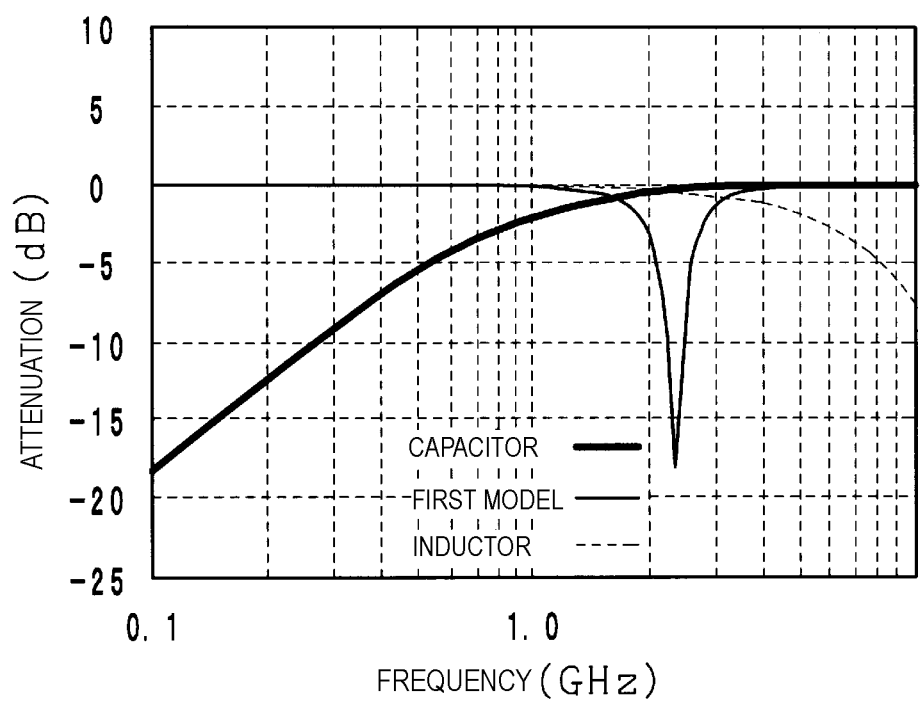
FIG. 4 is a graph illustrating bandpass characteristics of a first model, a capacitor, and an inductor.

The inventors of the present disclosure carried out the experiment and computer simulation described next to further clarify the effects provided by the electronic component 10. The inventors of the present disclosure combined capacitors and inductors in a discrete configuration, creating a first model of an LC parallel resonator having a resonant frequency at approximately 2.44 GHz and an attenuation of approximately 17 dB (also called a "discrete configuration" or an "LC parallel resonator having a discrete configuration" hereinafter). The inventors of the present disclosure then computed bandpass characteristics of the first model using a computer. The sizes of the capacitor and inductor were as follows.

length of capacitor and inductor in left-right direction: approximately 0.4 mm
width of capacitor and inductor in front-back direction: approximately 0.2 mm
height of capacitor and inductor in up-down direction: approximately 0.2 mm FIG. 4 is a graph illustrating the bandpass characteristics of the first model, the capacitor, and the inductor. The vertical axis represents attenuation, and the horizontal axis represents frequency. In FIG. 4, it can be seen that the first model has a resonant frequency of approximately 2.44 GHz and an attenuation of approximately 17 dB.

Figure 5:
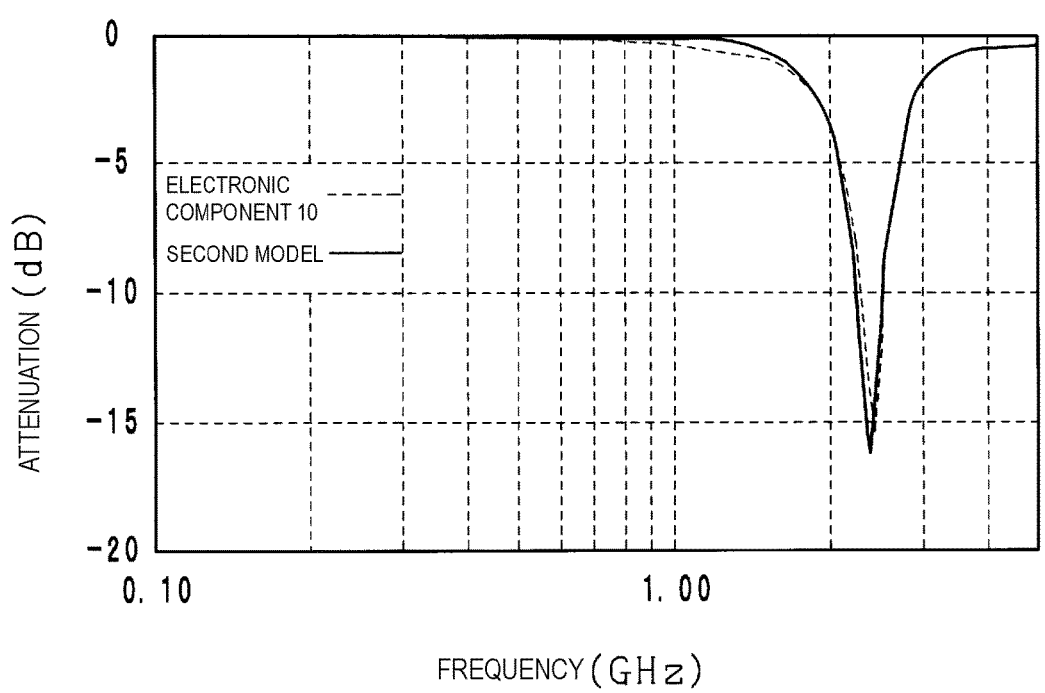
FIG. 5 is a graph illustrating bandpass characteristics of the electronic component and a second model.

Here, the inventors of the present disclosure investigated the structure of an electronic component 10 capable of obtaining the same results as those obtained by the first model (that is, a resonant frequency of approximately 2.44 GHz and an attenuation of approximately 17 dB), and created a second model having that structure. The inventors of the present disclosure then computed bandpass characteristics of the second model using a computer. FIG. 5 is a graph illustrating bandpass characteristics of the electronic component 10 and the second model. The vertical axis represents attenuation, and the horizontal axis represents frequency.

Comparing FIGS. 4 and 5, it can be seen that the bandpass characteristics of the first model and the bandpass characteristics of the second model have a similar result. Accordingly, the inventors of the present disclosure created an electronic component 10 having the structure of the second model and measured the actual bandpass characteristics of that electronic component 10. From FIG. 5, it can be seen that the result of actually measuring the electronic component 10 is close to a simulation result for the second model. As such, it can be seen that the electronic component 10 has a similar performance to that of the first model having the discrete configuration. In other words, it can be seen that the electronic component 10 can achieve a similar performance to that of the LC parallel resonator, which is a discrete component, despite the inductor L and the capacitor C being provided within a single element.

Meanwhile, although a discrete component requires two electronic components, a single electronic component is sufficient for the electronic component 10. Thus the electronic component 10 achieves miniaturization while achieving similar characteristics to the characteristics of the LC parallel resonator, which is a discrete component.

Figure 6:
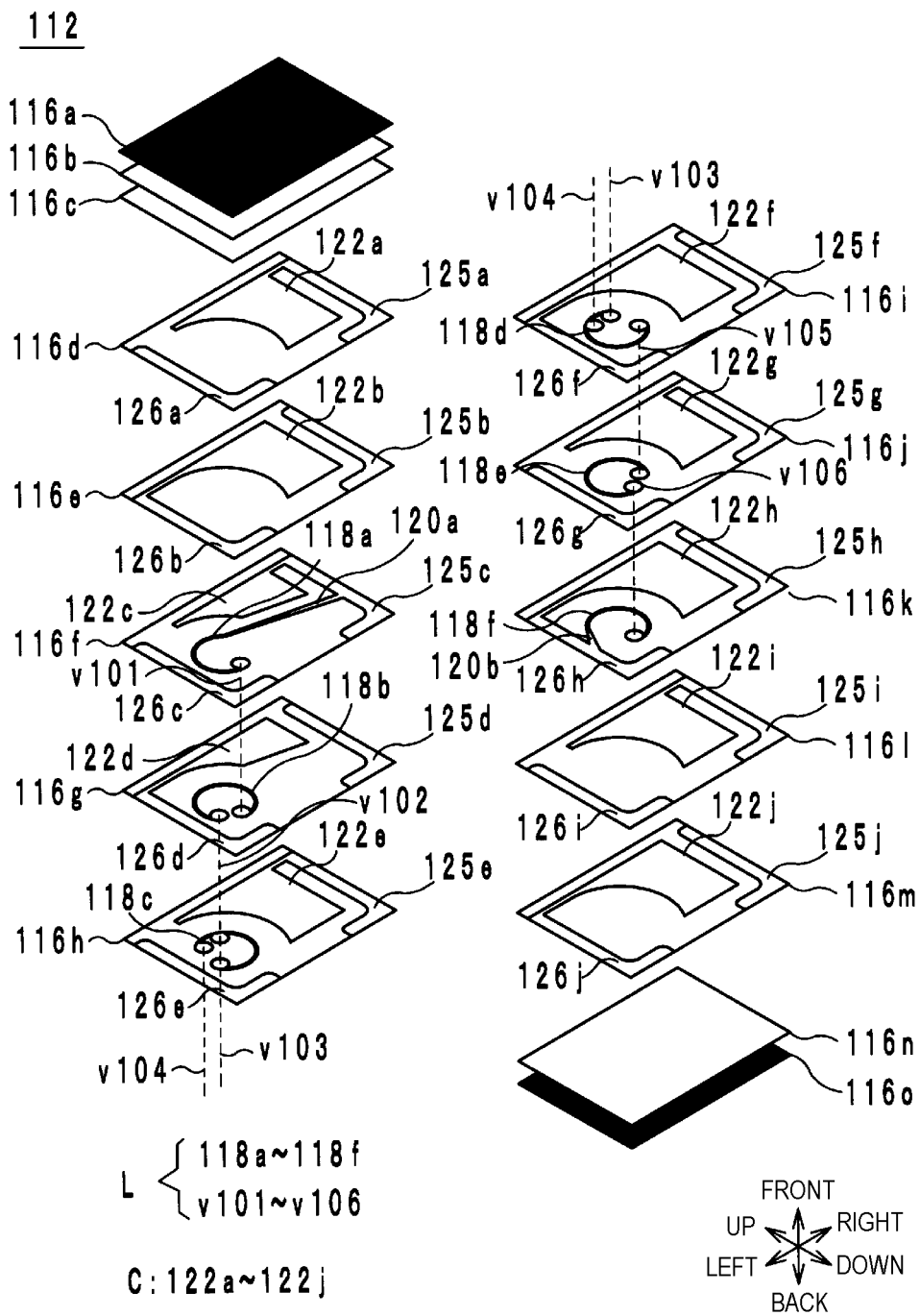
FIG. 6 is an exploded perspective view illustrating a multilayer body of an electronic component according to a reference example.

FIG. 6 is an exploded perspective view illustrating a multilayer body 112 of an electronic component 110 according to a reference example. In the electronic component 110, reference numerals for elements that are the same as those in the electronic component 10 add 100 to the corresponding reference numerals of the electronic component 10. As illustrated in FIG. 6, the electronic component 110 differs from the electronic component 10 in that the inductor L and the capacitor C are arranged left and right. In particular, the electronic component 110 is configured such that the lower ends of capacitor conductor layers 122c-122h are farther from the mounting surface than the lower ends of inductor conductor layers 118a-118f on the front surfaces of insulation layers 116f-116k on which the capacitor conductor layers 122c-122h and the inductor conductor layers 118a-118f are respectively provided. In other words, in the electronic component 110, the plurality of insulation layers 116a-116o do not have insulation layers corresponding to the insulation layers 16f-16k (an example of the first insulation layer). Note that the electronic component 110 is a structure conceived of by the inventors of the present disclosure, and is not a known structure.

The inventors of the present disclosure created samples of the electronic components 10 and 110, and mounted those samples on a circuit board. The inventors of the present disclosure then measured an electrostatic capacitance value, a resonant frequency, and an attenuation at the resonant frequency for each sample. The conditions of the experiments are given below. Note that the electronic components 10 and 110 were created for the purpose of trapping an approximately 2.44 GHz band, as is used in Wifi.

length of electronic components 10 and 110 in left-right direction: approximately 0.4 mm width of electronic components 10 and 110 in front-back direction: approximately 0.2 mm height of electronic components 10 and 110 in up-down direction: approximately 0.3 mm structure of inductor L: six-layer structure with approximately 4.5 turns line width of inductor L: approximately 15 μm inductance value of inductor L: approximately 2.0 nH structure of capacitor C: approximately 10 layers capacitance value of capacitor C: approximately 2.0 pF Note that the inductance value of the inductor L and the capacitance value of the capacitor C are target values based on the design. Furthermore, the inductance value is set so that a self-resonating frequency of the inductor L was sufficiently higher than the resonant frequency (approximately 2.44 GHz).

The Table is a table indicating experiment results.

TABLE

| | ELECTRONIC COMPONENT 10 | ELECTRONIC COMPONENT 110 |
|---|---|---|
| ELECTROSTATIC CAPACITANCE VALUE | approximately 2.0 pF | approximately 1.7 pF |
| RESONANT FREQUENCY | approximately 2.44 GHz | approximately 2.88 GHz |
| ATTENUATION | approximately −16.7 dB | approximately −14.7 dB |
| DIRECTIONALITY | NO | YES |

As indicated in the Table, with the electronic component 110 having an outer size of approximately 0.4 mm×0.2 mm×0.3 mm, a configuration capable of ensuring an inductance value of approximately 2.0 nH for the inductor L was only capable of achieving a maximum electrostatic capacitance value of approximately 1.7 pF for the capacitor C. Thus according to the electronic component 110, the resonant frequency could not be brought to the target of approximately 2.44 GHz.

Additionally, it can be seen that the attenuation at the resonant frequency is greater in the electronic component 10 than that at the resonant frequency in the electronic component 110. This is thought to be because the Q value of the inductor L is higher in the electronic component 10 than that of the inductor L in the electronic component 110. In other words, compared to the configuration of the electronic component 110, the configuration of the electronic component 10 has a small region where the inductor L is surrounded by conductors and little eddy current loss, which provides an improved Q value.

In the electronic component 110, the inductor L and the capacitor C do not have a substantially two-fold rotational symmetrical structure, leading to cases of directionality in the characteristics and therefore making it necessary to use caution with the orientation of the electronic component 110 during mounting. However, in the electronic component 10, the inductor L and the capacitor C have a substantially two-fold rotational symmetrical structure, meaning there are almost no cases of directionality in the characteristics and it is unnecessary to use caution with the orientation of the electronic component 10 during mounting.

OTHER EMBODIMENTS

The electronic component according to the present disclosure is not limited to the above-described electronic component 10, and can be modified without departing from the essential spirit thereof.

In the electronic component 10, it is sufficient that the lower ends U1 of the capacitor conductor layers 22c-22h be located closer to the lower surface of the multilayer body 12 than the lower ends U2 of the inductor conductor layers 18a-18f, and the capacitor conductor layers 22c-22h need not be present between the center axis Ax and the lower surface of the multilayer body 12. In other words, the inductor conductor layers 18a-18f and the capacitor conductor layers 22c-22h may be arranged left and right. With this configuration as well, the inductor L is distanced from the circuit board and thus a drop in the inductance value and the Q value can be suppressed.

Additionally, the inductor L and the capacitor C need not have a substantially two-fold rotational symmetrical structure with respect to the straight line L0.

Additionally, the outer electrodes 14a and 14b may be provided only on the lower surface of the multilayer body 12, and need not be provided on the right surface and the left surface of the multilayer body 12, respectively. In this case, the capacitor C can be brought closer to the right surface and the left surface of the multilayer body 12, which increases the surface area of the capacitor C and makes it possible to increase the capacitance value of the capacitor C.

Note that the inductor conductor layers 18a-18f are provided on the insulation layers 16f-16k and the capacitor conductor layers 22c-22h are provided on the insulation layers 16f-16k. In other words, all of the insulation layers on which the inductor conductor layers 18a-18f are provided are the insulation layers 16f-16k (an example of a first insulation layer) on which the capacitor conductor layers 22c-22h are provided. However, capacitor conductor layers need not be provided on all of the insulation layers 16f-16k on which the inductor conductor layers 18a-18f are provided. In other words, it is sufficient that the insulation layers 16a-16o include at least one insulation layer on which an inductor conductor layer and a capacitor conductor layer are provided. However, it is desirable that the insulation layers 16a-16o include a plurality of insulation layers on which an inductor conductor layer and a capacitor conductor layer are provided.

The electronic component 10 may be produced through a sequential pressure-bonding method in which ceramic green sheets on which conductor layers are provided are laminated and pressure-bonded one at a time to form an unfired multilayer body, after which the unfired multilayer body is fired.

Although the inductor L is described as having a substantially helical shape, a three-dimensional spiral shape, the inductor L may have a substantially two-dimensional spiral shape instead. Note that in the case where the inductor L is a substantially two-dimensional spiral shape, the border between an inductor conductor layer and a lead conductor layer refers to a part where the conductor separates from the substantially two-dimensional spiral-shaped path.

Note also that although the capacitor C is described as having a substantially U shape when viewed from the front, the shape of the capacitor C is not limited thereto. The capacitor C may have a substantially rectangular shape extending in the left-right direction below the inductor L, for example.

Additionally, although the capacitor C and the inductor L form an LC parallel resonator, the capacitor C and the inductor L may form an LC resonator aside from an LC parallel resonator (an LC serial resonator, for example). Furthermore, the capacitor C and the inductor L need not form an LC resonator.

Additionally, outer electrodes aside from the outer electrodes 14a and 14b may be additionally provided. For example, in the case where the capacitor C and the inductor L do not form an LC resonator as described above, a total of four outer electrodes, namely two outer electrodes connected to both ends of the capacitor C and two outer electrodes connected to both ends of the inductor L, respectively, may be provided.

As described above, the present disclosure is useful in electronic components, and is particularly advantageous in that degradation in the characteristics of an inductor can be suppressed.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An electronic component comprising:
   a substantially rectangular parallelepiped multilayer body formed by laminating a plurality of insulation layers including a first insulation layers in a lamination direction;
   a capacitor including a plurality of capacitor conductor layers provided on main surfaces of the insulation layers; and
   a substantially spiral-shaped inductor including one or more inductor conductor layers provided on main surfaces of the insulation layers and having a center axis extending along the lamination direction,
   wherein a mounting surface of the multilayer body is a surface of the multilayer body located on the end of one side of a first orthogonal direction orthogonal to the lamination direction;
   the inductor conductor layer and the capacitor conductor layer are provided on the main surfaces of the first insulation layer;
   on the main surfaces of the first insulation layer, an end portion of the capacitor conductor layer on the one side of the first orthogonal direction is closer to the mounting surface than an end portion of the inductor conductor layer on the one side of the first orthogonal direction; and
   on the main surfaces of the first insulation layer, the capacitor conductor layer is present between the inductor conductor layer and the mounting surface.

2. The electronic component according to claim 1, wherein on the main surfaces of the first insulation layer, the inductor conductor layer, the capacitor conductor layer, and the mounting surface are arranged in that order on an imaginary line parallel to the first orthogonal direction and passing through the center axis.

3. The electronic component according to claim 1, wherein the capacitor and the inductor form an LC resonator.

4. The electronic component according to claim 1, further comprising:
   a first outer electrode and a second outer electrode that are electrically connected to the capacitor and the inductor and are provided on the mounting surface.

5. The electronic component according to claim 4,
wherein a direction orthogonal to the lamination direction and the first orthogonal direction is defined as a second orthogonal direction;
a surface of the multilayer body located on the end of one side in the second orthogonal direction is defined as a first side surface; and
the first outer electrode straddles the mounting surface and the first side surface.

6. The electronic component according to claim 1,
wherein the capacitor and the inductor have a substantially two-fold rotational symmetrical structure with respect to an axis that passes through a point where diagonal lines of the mounting surface intersect and that is parallel to the lamination direction.

7. The electronic component according to claim 1,
wherein a surface of the insulation layers located on another side of the first orthogonal direction is defined as a fourth side; and
when viewed from the lamination direction, the capacitor conductor layers is not present between the center axis and the fourth side.

8. The electronic component according to claim 1,
wherein the plurality of insulation layers include a plurality of the first insulation layers.

9. The electronic component according to claim 1,
wherein the insulation layers on which the one or more inductor conductor layers are provided are all the first insulation layers.

10. An electronic component comprising:
a substantially rectangular parallelepiped multilayer body formed by laminating a plurality of insulation layers including a first insulation layers in a lamination direction;
a capacitor including a plurality of capacitor conductor layers provided on main surfaces of the insulation layers;
a substantially spiral-shaped inductor including one or more inductor conductor layers provided on main surfaces of the insulation layers and having a center axis extending along the lamination direction; and
a first outer electrode and a second outer electrode that are electrically connected to the capacitor and the inductor and are provided on a mounting surface of the multilayer body, the mounting surface being a surface of the multilayer body located on the end of one side of a first orthogonal direction orthogonal to the lamination direction;
wherein the inductor conductor layer and the capacitor conductor layer are provided on the main surfaces of the first insulation layer;
on the main surfaces of the first insulation layer, an end portion of the capacitor conductor layer on the one side of the first orthogonal direction is closer to the mounting surface than an end portion of the inductor conductor layer on the one side of the first orthogonal direction; and
no outer electrodes aside from the first outer electrode and the second outer electrode are provided.

11. An electronic component comprising:
a substantially rectangular parallelepiped multilayer body formed by laminating a plurality of insulation layers including a first insulation layers in a lamination direction;
a capacitor including a plurality of capacitor conductor layers provided on main surfaces of the insulation layers; and
a substantially spiral-shaped inductor including one or more inductor conductor layers provided on main surfaces of the insulation layers and having a center axis extending along the lamination direction,
wherein a mounting surface of the multilayer body is a surface of the multilayer body located on the end of one side of a first orthogonal direction orthogonal to the lamination direction;
the inductor conductor layer and the capacitor conductor layer are provided on the main surfaces of the first insulation layer;
on the main surfaces of the first insulation layer, an end portion of the capacitor conductor layer on the one side of the first orthogonal direction is closer to the mounting surface than an end portion of the inductor conductor layer on the one side of the first orthogonal direction;
a direction orthogonal to the lamination direction and the first orthogonal direction is defined as a second orthogonal direction;
a surface located on one side of the second orthogonal direction on the main surfaces of the insulation layers is defined as a first side, a surface located on another side of the second orthogonal direction on the main surfaces of the insulation layers is defined as a second side, and a surface located on the one side of the first orthogonal direction on the main surfaces of the insulation layers is defined as a third side; and
on the main surface of the first insulation layer, when viewed from the lamination direction, the capacitor conductor layer straddles a region between the inductor conductor layer and the first side, a region between the inductor conductor layer and the third side, and a region between the inductor conductor layer and the second side.

* * * * *